(12) United States Patent
Yamato et al.

(10) Patent No.: US 11,219,102 B2
(45) Date of Patent: Jan. 4, 2022

(54) METHOD FOR DRIVING DISPLAY DEVICE AND DISPLAY DEVICE

(71) Applicant: SHARP KABUSHIKI KAISHA, Sakai (JP)

(72) Inventors: Asahi Yamato, Sakai (JP); Hikaru Kuki, Sakai (JP); Akira Nomura, Sakai (JP)

(73) Assignee: SHARP KABUSHIKI KAISHA, Osaka (JP)

(*) Notice: Subject to any disclaimer, the term of this patent is extended or adjusted under 35 U.S.C. 154(b) by 0 days.

(21) Appl. No.: 16/981,487

(22) PCT Filed: Mar. 30, 2018

(86) PCT No.: PCT/JP2018/013800
§ 371 (c)(1),
(2) Date: Sep. 16, 2020

(87) PCT Pub. No.: WO2019/187063
PCT Pub. Date: Oct. 3, 2019

(65) Prior Publication Data
US 2021/0027708 A1    Jan. 28, 2021

(51) Int. Cl.
*G09G 3/3233* (2016.01)
*H05B 33/08* (2020.01)

(52) U.S. Cl.
CPC ......... *H05B 33/08* (2013.01); *G09G 3/3233* (2013.01); *G09G 2300/08* (2013.01);
(Continued)

(58) Field of Classification Search
CPC ............ G09G 3/3233; G09G 2300/08; G09G 2310/08; G09G 2320/0247; G09G 2330/021; G09G 2300/0842; G09G 2300/0819; H05B 33/08; H01L 27/32; H01L 51/50; G09F 9/30
See application file for complete search history.

(56) References Cited

U.S. PATENT DOCUMENTS

2006/0007092 A1* 1/2006 Sekiguchi ............ G09G 3/3655
                                                      345/92
2007/0152945 A1* 7/2007 Park .................... G09G 3/3413
                                                      345/98
(Continued)

FOREIGN PATENT DOCUMENTS

JP         2014-044316 A       3/2014

OTHER PUBLICATIONS

Dictionary.com, "adjacent," in Dictionary.com Unabridged. Source location: Random House, Inc. http://dictionary.reference.com/browse/adjacent, Nov. 18, 2011, p. 1.*

*Primary Examiner* — Jeff Piziali
(74) *Attorney, Agent, or Firm* — ScienBiziP, P.C.

(57) ABSTRACT

The disclosure provides a display device driving method and a display device. In driving the display device in which any one of a first frequency drive and a second frequency drive can be selected as a specific frequency, for a scanning period at the specific frequency from a start of a quenching period for a first row forming a frame to an end of a quenching period for a last row forming the frame, the scanning period in the second frequency drive is shorter than the scanning period in the first frequency drive.

20 Claims, 5 Drawing Sheets

(52) U.S. Cl.
CPC . *G09G 2310/08* (2013.01); *G09G 2320/0247* (2013.01); *G09G 2330/021* (2013.01)

(56) References Cited

U.S. PATENT DOCUMENTS

| | | | |
|---|---|---|---|
| 2008/0117196 A1* | 5/2008 | Lee | G09G 3/3225 345/208 |
| 2010/0026677 A1* | 2/2010 | Shikina | G09G 3/325 345/213 |
| 2011/0057917 A1* | 3/2011 | Ryu | G09G 3/3266 345/211 |
| 2016/0224157 A1* | 8/2016 | Yang | G06F 3/04184 |
| 2017/0116922 A1* | 4/2017 | Jung | G09G 3/3258 |
| 2017/0116946 A1* | 4/2017 | Nakatani | G09G 3/3677 |
| 2017/0206837 A1* | 7/2017 | Jeon | G09G 3/3258 |
| 2017/0249901 A1* | 8/2017 | Nakamura | G09G 3/3258 |

* cited by examiner

METHOD FOR DRIVING DISPLAY DEVICE AND DISPLAY DEVICE

TECHNICAL FIELD

The disclosure relates to a method of driving a display device including pixels arranged in a matrix, and also relates to a display device.

BACKGROUND ART

Current-drive type organic EL elements are well known in an example of electro-optical elements included in pixels arranged in a matrix. In recent years, active development of organic EL displays including organic ELs in pixels is underway as a display incorporating a display device increases in size and decreases in thickness, which attracts attention in terms of vividness of displayed images.

In particular, the display device is often an active matrix type display device in which a current-drive type electro-optical element is provided in each pixel together with a switching element such as a thin film transistor (TFT) to individually control the electro-optical element so that the electro-optical element is controlled for each pixel. This is because, if the display device is an active matrix type display device, an image can be displayed with higher-resolution than a passive type display device.

Here, a connection line formed along a horizontal direction for each row, and a data line and a power supply line formed along a vertical direction for each column are provided in an active matrix type display device. Each of the pixels includes an electro-optical element, a connection transistor, a drive transistor, and a capacitance. The connection transistor is turned on if a voltage is applied to the connection line, and data can be written if the capacitance is charged with a data voltage (data signal) on the data line. The drive transistor is turned on by the data voltage with which the capacitance is charged, and the current from the power supply line is caused to flow through the electro-optical element so that the pixels can emit light.

Furthermore, when an active matrix type display device forms an image by causing pixels arranged on the display device to emit light according to the data signal, it is possible to display a moving image and the like if one frame in which the image is formed by one scan operation of the connection line in the vertical direction is driven at a specific frequency (specific frequency).

Here, the specific frequency may be set to a high frequency during a normal operation such as an operation performed in a case where a user of a mobile information terminal or the like incorporating the display device operates the mobile information terminal or the like to view image information from the display device, and may be set to a low frequency in a case where, for example, during standby, the user does not need to actively acquire the image information from the display device. According to Patent Literature 1, the power consumption of the display device can be reduced if the display device employs such a drive at a low frequency.

CITATION LIST

Patent Literature

PTL 1: JP 2014-44316 A

SUMMARY

Technical Problem

However, if the above-described active matrix type display device is driven at a low frequency, there is a problem in that flicker tends to occur due to a quenched state occurring during writing of a data signal into a pixel.

Solution to Problem

Therefore, to solve the above-described problems, a display device driving method according to the disclosure includes driving a frame formed by a plurality of pixels arranged in a matrix including rows and columns at a specific frequency selected from any one of a first frequency drive and a second frequency drive for driving the frame at a lower frequency than the first frequency drive, providing a quenching period and a light emission period in one frame period for a specific row included in a part of the frame and writing a data signal into pixels included in the specific row during the quenching period, sequentially starting a quenching period for a next specific row adjacent to the specific row in a row direction after a start of the quenching period for the specific row, and for a scanning period, at the specific frequency, from a start of the quenching period for a first row included in the frame to an end of the quenching period for a last row included in the frame, shortening a scanning period in the second frequency drive than a scanning period in the first frequency drive.

Furthermore, to solve the above-described problems, in a display device according to the disclosure, a frame formed by a plurality of pixels arranged in a matrix including rows and columns is driven at a specific frequency selected from any one of a first frequency drive and a second frequency drive for driving the frame at a lower frequency than the first frequency drive, a quenching period and a light emission period are provided in one frame period for a specific row included in a part of the frame, and a data signal is written into pixels included in the specific row during the quenching period, after a start of the quenching period for the specific row, a quenching period for a next specific row adjacent to the specific row in a row direction is sequentially started, and for a scanning period, at the specific frequency, from a start of the quenching period for a first row included in the frame to an end of the quenching period for a last row included in the frame, a scanning period in the second frequency drive is shorter than a scanning period in the first frequency drive.

Here, the one frame period refers to a time period corresponding to one cycle of the specific frequency. The frequency drive refers to scanning of the frame at a specific frequency per unit of time, and may be expressed in Hz hereinafter.

In the display device driving method or the display device, it is preferable that a fast scan drive in which the scanning period in the second frequency drive is shorter than the one frame period is performed, and after the fast scan drive is finished in the one frame period, no scan is performed until a start of a next one frame period.

Furthermore, in the display device driving method or the display device, it is preferable that, in the first frequency drive, the one frame period and a time period from a start of writing in the first row to an end of writing in the last row coincide, and in the second frequency drive, a time period from a start of writing in the first row to an end of writing in the last row is shorter than the one frame period.

Note that, the fact that the time of completion of writing in the last row coincides with the time of completion of the one frame period includes not only a case where the time of completion of writing in the last row and the time of completion of the one frame period are exactly the same, but also a case where the times substantially coincide, but have a slight difference due to conditions of the circuit design and the like.

Furthermore, in the display device driving method or the display device, it is preferable that a time period during which the data signal is written into the pixels included in the specific row during the quenching period in the second frequency drive is set shorter than a time period during which the data signal is written into the pixels included in the specific row during the quenching period in the first frequency drive.

In the display device driving method or the display device, it is preferable that the quenching period of the specific row in the second frequency drive is set shorter than the quenching period of the specific row in the first frequency drive.

Furthermore, in the display device driving method or the display device, it is preferable that the specific row includes a plurality of rows in the second frequency drive, and a quenching period of the plurality of rows and writing of the data signal into the pixels included in the specific row have the same timing.

A specific configuration example of these configurations will be described. For example, in the first frequency drive, a specific row is one specific row, and a data signal is written into each pixel forming the one specific row. On the other hand, in the second frequency drive, two specific rows are selected as the specific rows, for example, and a data signal is written into each pixel forming the two rows. At this time, the same data signal is written into two of the pixels connected to the same data line. That is, it is possible to provide a configuration in which the resolution is reduced in half during the second frequency drive and the same potential is written into the two pixels connected to the same data line.

Note that, although needless to say, it is preferable that the specific row is formed by a single row.

Furthermore, in the display device driving method or the display device, it is preferable that at a certain timing during the scanning period, the number of specific rows during the quenching period is greater in the second frequency drive than in the first frequency drive.

In the display device driving method or the display device, the second frequency drive is preferably a drive at 0.1 Hz to 45 Hz, is preferably a drive at 1 Hz to 45 Hz, or is preferably a drive at 10 Hz to 45 Hz, and is more preferably a drive at 30 Hz to 45 Hz. Furthermore, in some instances, the second frequency drive may be a drive at 0.1 Hz to 10 Hz, and may preferably be a drive at 0.1 Hz to 1 Hz.

This is because, if a drive frequency is lower than 0.1 Hz, it may not be possible to sufficiently suppress an influence of a factor causing flicker. This is because, if the drive frequency is higher than 45 Hz, the frequency is sufficiently high, and thus, flicker is unlikely to be a problem even if the disclosure is not applied. If a range of the drive frequency is set to 30 Hz to 45 Hz, a sufficient effect of reducing power consumption can be expected, and thus, this range is useful as a drive region. Therefore, if the disclosure is applied in the range of 30 Hz to 45 Hz, it is possible to realize a driving method and a display device capable of providing an effect of improving visibility by reducing flicker in addition to an effect of reducing power consumption.

A display device may be driven at a very low drive frequency of 0.1 Hz to 10 Hz or 0.1 Hz to 1 Hz, and in such a case, the effect of reducing power consumption according to the disclosure can be expected.

Furthermore, in the display device driving method or the display device, it is preferable that in the second frequency drive, a second frequency matrix formed by a region having a smaller area or a smaller number of pixels than the matrix is used as one frame.

A display portion of the second frequency matrix corresponding to one frame visually recognized as an image is small, and thus, an effect of suppressing flicker can be improved compared to a case where the second frequency drive is performed on the entire screen.

In the second frequency matrix, a case is assumed where a screen is displayed that includes a clock function in a region formed by a smaller area or by a smaller number of pixels than the matrix, and the like. In this case, it is preferable that an electro-optical element in a matrix portion other than the second frequency matrix is turned off.

The second frequency matrix may move within the matrix forming the entire screen whenever a specific time period elapses.

In the display device driving method or the display device, it is preferable that each of the plurality of pixels includes an electro-optical element configured to receive, from an anode, a current from a drive power supply and emit light, a cathode being connected to a cathode power supply in the electro-optical element, a connection line formed along a horizontal direction for each row of the matrix, a data line formed along a vertical direction for each column of the matrix, a drive transistor connected in series between the drive power supply and the electro-optical element, the drive transistor configured to cause a drive current corresponding to a gate potential to flow from the drive power supply to the electro-optical element, a first connection transistor including a gate connected to the connection line, the first connection transistor configured to control whether to supply a data signal from the data line to a gate of the drive transistor, and a capacitance inserted and arranged between the gate of the drive transistor and the drive power supply, the data signal supplied via the first connection transistor being written into the capacitance.

A suitable light emitting element selected from self-luminous elements such as an organic EL element, a field emission element, and a plasma light emitting element can be employed for the electro-optical element. It is preferable to employ the organic EL because the organic EL has excellent properties in weight reduction of the display device.

Furthermore, it may be preferable that in the display device driving method or the display device, a source of the drive transistor is connected to a shared line connecting the drive power supply and the data line, and a source of the first connection transistor is connected between a drain of the drive transistor and the electro-optical element, the display device includes a first blocking transistor connected in series between the drive transistor and the drive power supply, a second blocking transistor being connected in series between the drive transistor and the electro-optical element, closer to the electro-optical element than a node relative to the first connection transistor, and having the same on-off operation as the first blocking transistor, a second connection transistor being connected in series between the drive transistor and the data line and having the same on-off operation as the first connection transistor, and an initialization transistor including a source connected between the first connection transistor and the capacitance, on-off operations of the first blocking transistor and the second blocking transistor, the first connection transistor and the second connection transistor are driven inversely, and the initialization transistor is turned off at least while the drive current flows through the electro-optical element from a writing of the data signal into the capacitance during one frame period.

Release of a leakage current from the capacitance while the drive current flows through the electro-optical element can be effectively suppressed by the first connection transistor and the initialization transistor that are turned off. Therefore, it is possible to further reduce luminance variation of the electro-optical element, particularly during the second frequency drive.

Release of a leakage current from the capacitance while the drive current flows through the electro-optical element can be effectively suppressed by the first connection transistor and the initialization transistor that are turned off. Therefore, it is possible to further reduce the luminance variation of the electro-optical element that maintains the light emission state during one frame period, particularly during the second frequency drive.

The display device according to the disclosure can be applied to an information terminal such as a mobile phone, a tablet type terminal, a car navigation system, or a personal computer, or a moving image display device such as a television, a video recorder, or a video player. The disclosure is not limited to these applications and can be widely applied.

Advantageous Effects of Disclosure

According to the disclosure, occurrence of flicker resulting from a quenching period during a second frequency drive can be effectively suppressed.

The disclosure includes a first connection transistor and an initialization transistor having a source connected between the first connection transistor and the capacitance, and thus, it is possible to effectively prevent a loss of charge from a holding capacitance held in the capacitance during the second frequency drive. Therefore, the effect of suppressing the luminance variation of the electro-optical element can be enhanced, and occurrence of flicker can be suppressed more effectively.

DESCRIPTION OF EMBODIMENTS

Figure 1:
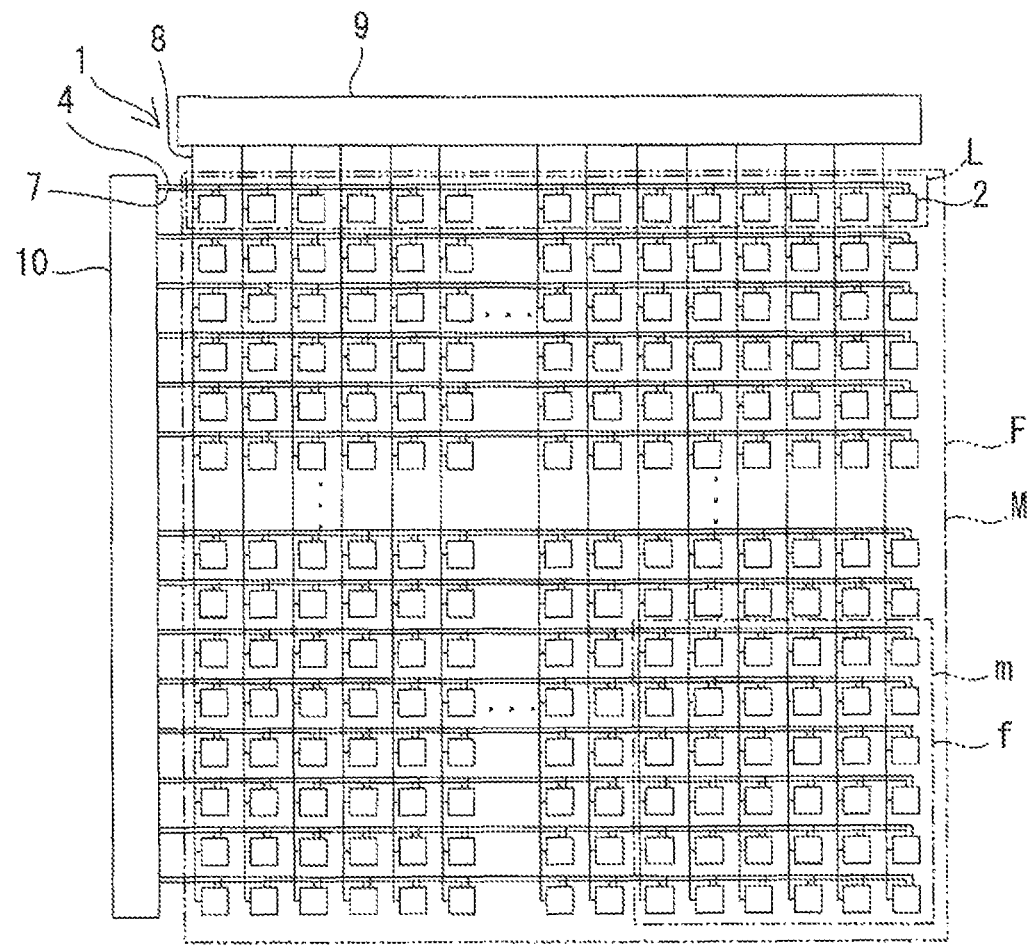
FIG. 1 is a diagram illustrating an overview of a display device 1 in which pixels 2 are arranged in a matrix M, and drive units 9 and 10 that perform drive control of the pixels 2.

An embodiment according to the disclosure will be described below in detail with reference to the drawings. Note that, in the present specification and the drawings, constituent elements having substantially the same functional configuration will be given the same reference numerals, and duplicate description will be omitted.

FIG. 1 illustrates a schematic diagram of a display apparatus including a display device 1 common to a first embodiment and a second embodiment described below. The display apparatus includes a frame F including a plurality of pixels 2 arranged in a matrix M having rows in a horizontal direction and columns in a vertical direction, and a vertical drive unit 10 and a horizontal drive unit 9 that are connected to each of the pixels 2 and perform drive control of each of the pixels 2. The frame F includes rows each of which includes i pixels 2 arranged horizontally, and the rows include from a first row to a j-th row arranged in parallel in the vertical direction. Note that i and j are integers of 1 or greater.

A drive power supply line 4 is formed in each row of the matrix M along the horizontal direction, and is connected to each of the i pixels 2 arranged horizontally. Furthermore, a connection line 7 is formed in each row of the matrix M along the horizontal direction, and is connected to each of the i pixels 2 arranged horizontally. In addition, a data line 8 is formed in each column of the matrix M along the vertical direction, and is connected to each of the j pixels 2 arranged vertically.

The vertical drive unit 10 controls supply of a drive voltage ELVDD from a drive power supply 3 via the drive power supply line 4 to the pixels 2, and performs on-off control of a connection transistor via the connection line 7. On the other hand, the horizontal drive unit 9 writes a data signal D into each of the pixels 2 via the data line 8.

In the frame F, the data signal D is written for each row under the on-off control of the connection line 7. A row in which the data signal D is written needs to be quenched. Hereinafter, a row included in a part of the frame F is referred to as a specific row L. One row or a plurality of rows can be selected as the specific row L.

An image displayed on one display screen is formed by sequentially emitting light according to the data signal D from a first row at a vertical upper end of the frame F toward a lower side of the frame F in the vertical direction, and emitting light until the last row.

A time period for one cycle from a start of preparation for reception of the data signal D by a signal voltage from the connection line 7 in a first row L1 arranged at the vertical upper end of the frame F until a final row Lk including the j-th row is caused to emit light to form a predetermined image on the frame F and shortly before the specific row L at the vertical upper end of the frame F starts again the preparation is referred to as one frame period Tf. The one frame period Tf corresponds to one cycle of a specific frequency described below. Here, k satisfies k≤j, and is an integer equal to or greater than 1. If only one row is selected for the specific row L, then k=j.

The specific row L includes a period during which a row is quenched and a period during which a row emits light in one frame period Tf. A quenching period Tn is defined as a time period during which the specific row L is quenched, and a light emission period To is defined as a time period during which the specific row L is caused to emit light. Note that the quenching period Tn is preferably constant for each specific row L at one specific frequency unless there are special circumstances. This is because, if the quenching period Tn is different for each specific row, the light emission period To during one frame period Tf varies for each specific row, and thus, this causes uneven light emission of an image formed on the frame F. Therefore, in the following description of the embodiments, the quenching period Tn for each specific row L at one specific frequency is constant unless otherwise stated. Note that special circumstances include a case where the quenching period Tn is finely adjusted to complement a difference in individual performance of an electro-optical element 11 and a drive transistor T1.

After a start of a quenching period Tn1 for the first row L1, a quenching period Tn2 for a next specific row L2 adjacent to the specific row L1 in a row direction is started, and quenching periods are sequentially started until a quenching period Tnk for the last row Lk.

A time period from the start of the quenching period Tn1 to the end of the quenching period Tnk is defined as a scanning period Ts. In the following description of the embodiments, start times of the one frame period Tf and the scanning periods Ts corresponding to the one frame period Tf are assumed to coincide.

First Embodiment

Figure 2:
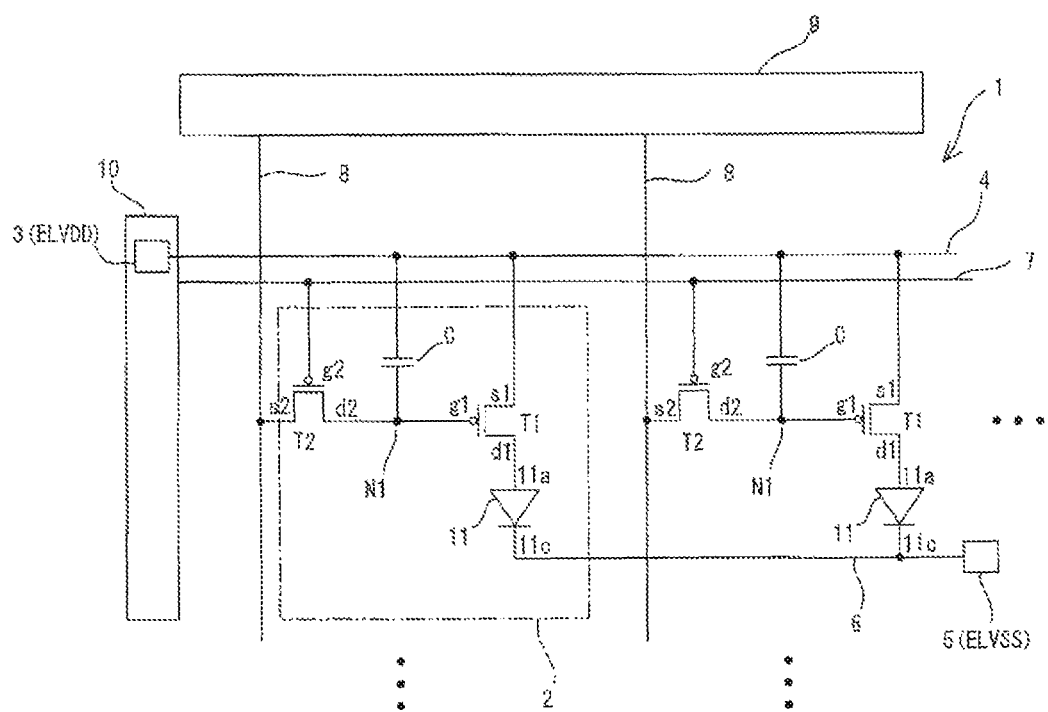
FIG. 2 is a diagram illustrating a circuit structure of the display device 1 according to a first embodiment.

FIG. 2 is an enlarged circuit diagram of a part of the display device 1 including the pixels 2 included in the matrix M in FIG. 1. In FIG. 2, the pixel 2, the drive power supply line 4 connected to the drive power supply 3, a cathode power supply line 6 connected to a cathode power supply 5, the connection line 7, and the data line 8 are provided.

The pixel 2 includes an organic EL element 11 serving as the electro-optical element, the drive transistor T1, a first connection transistor T2, and a capacitor C serving as a capacitance.

The organic EL element 11 receives, from an anode 11a via the drive power supply line 4, a current from the drive power supply 3 to emit light, and a cathode 11c is connected to the cathode power supply 5 via the cathode power supply line 6.

The drive transistor T1 is connected in series between the drive power supply 3 and the organic EL element 11. The drive transistor T1 causes a drive current Id corresponding to a potential of a gate g1 to flow from the drive power supply 3 to the organic EL element 11.

In the first connection transistor T2, a gate g2 is connected to the connection line 7, a source s2 is connected to the data line 8, and a drain d2 is connected to the gate g1 of the drive transistor T1. The first connection transistor T2 controls, according to a signal from the connection line 7, whether the data signal D from the data line 8 is supplied to the gate g1 of the drive transistor T1.

The capacitor C is inserted and arranged between the gate g1 of the drive transistor T1 and the drive power supply 3. The data signal D supplied via the first connection transistor T2 can be written into the capacitor C.

Next, an operation of the display device 1 according to the present embodiment will be described.

If a signal voltage from the connection line 7 is applied to the first connection transistor T2, the data signal D from the data line 8 is written into the capacitor C as data voltage Vdata. After the writing of the data signal D into the capacitor C is completed, the application of the signal voltage from the connection line 7 is stopped, the first connection transistor T2 is blocked, and the data voltage Vdata is held on a side of a node N1 of the capacitor C.

The data voltage Vdata is applied to the gate g1 to turn on the drive transistor T1. Next, the drive current Id flows from the drive power supply 3 to the organic EL element 11 via the drive transistor T1, and thus, the organic EL element 11 emits light. The drive current Id flows from the cathode power supply line 6 to the cathode power supply 5 through the organic EL element 11 until the one frame period Tf ends.

Next, a method of driving the display device 1 according to the present embodiment will be described.

The display device 1 can form an image on the matrix by periodically scanning the matrix with the connection line 7 at a specific frequency in a column direction. The method of driving the display device 1 at a specific frequency includes high frequency drive (first frequency drive) $\omega 1$ and low frequency drive (second frequency drive) $\omega 2$ in which the display device 1 is driven at a lower frequency than the high frequency drive $\omega 1$. The display device 1 can select any one of the high frequency drive $\omega 1$ and the low frequency drive $\omega 2$ under a predetermined condition.

During a normal operation such as an operation performed in a case where information is displayed on the display device 1 and a user actively attempts to acquire the information, the information needs to be displayed at high luminance to improve the visibility of the information. Furthermore, during the normal operation, the display device 1 is driven in the high frequency drive $\omega 1$ to accurately display image information, such as moving images, having large changes in time. In the present embodiment, the display device 1 is driven at 60 Hz in the high frequency drive $\omega 1$.

On the other hand, during an information reduction operation such as an operation during a standby time period during which the user does not actively acquire information, it is not necessary to display an image having large changes in time on the display device 1. During the information reduction operation, the display device 1 is preferably driven in the low frequency drive $\omega 2$ to reduce power consumption. In the present embodiment, the display device 1 is driven at 30 Hz in the low frequency drive $\omega 2$.

Here, in order to cause the organic EL element 11 to emit light, an operation of writing the data signal D into the capacitor C is necessary to turn on the drive transistor T1 by applying the data voltage Vdata to the gate g1. This is because, when the operation of writing the data signal D is performed, after the drive transistor T1 temporarily is turned off and the organic EL element 11 is quenched, it is necessary to write a new data signal D during the quenching period Tn to prevent the organic EL element 11 from emitting light due to unintended accumulation of the data voltage Vdata.

In an example, a case where each row is selected for the specific row L will be described.

Hereinafter, a scanning period in the high frequency drive $\omega 1$ is referred to as a scanning period $Ts\omega 1$, and one frame period in the high frequency drive $\omega 1$ is referred to as one frame period $Tf\omega 1$. A scanning period in the low frequency drive ω2 is referred to as a scanning period Tsω2, and one frame period in the low frequency drive ω2 is referred to as one frame period Tfω2.

Figure 4:
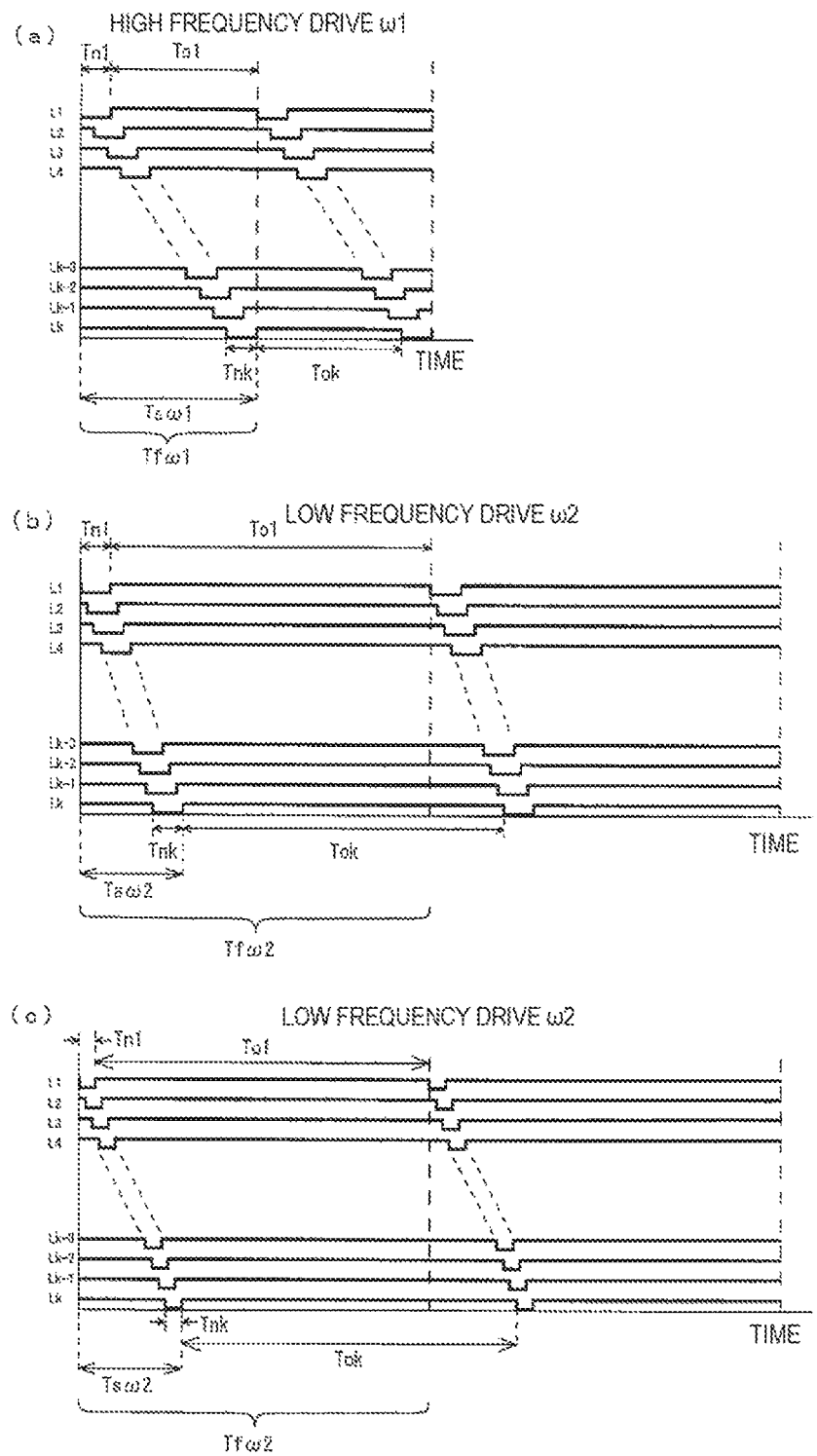
FIG. 4 is graphs for comparing a scanning period Ts when each row is selected for a specific row L, between a case where the display device 1 is driven in high frequency drive ω1 and a case where the display device 1 is driven in low frequency drive ω2. (a) and (b) illustrate a case where a quenching period Tn is the same, and (c) illustrates a case where the quenching period Tn obtained when the display device 1 is driven in the low frequency drive ω2 is further reduced compared to the quenching period Tn obtained when the display device 1 is driven in the high frequency drive ω1 in (a).

A driving method according to the disclosure will be described with reference to FIG. 4. Here, a horizontal axis in FIG. 4 indicates time, and a vertical axis in FIG. 4 indicates an arrangement of the specific rows L1 to Lk in the frame F. The graphs in FIG. 4 represent a light emission state of each of the specific rows, and a low level represents a quenched state. A length of the horizontal axis of a high level section represents the light emission period To, and a length of the horizontal axis of a low level section represents the quenching period Tn. Here, in FIG. 4, the quenching periods Tn are referred to by Tn1 to Tnk corresponding to the specific rows L1 to Lk, and the light emission periods To are referred to by To1 to Tok corresponding to the specific rows L1 to Lk.

In the high frequency drive ω1 in the normal operation, as illustrated in FIG. 4(a), the display device 1 can be driven so that the scanning period Tsω1 and the one frame period Tfω1 coincide, and flicker is not observed even in such a drive.

Here, the light emission of the organic EL element 11 needs to be turned off and quenched during an update of data, and the longer the quenching period Tn, the greater the change in luminance, which causes flicker. A lower limit of the number (number of lines) of the specific rows L that can be quenched at the same time depends on a panel included in the display device 1.

On the other hand, if a scanning speed for the frame F increases, it possible to reduce the influence of luminance reduction due to the quenched state of the organic EL element 11. In a specific example, in the low frequency drive ω2 in the information reduction operation, occurrence of flicker can be suppressed if the scanning period Tsω2 is shorter than the scanning period Tsω1 as illustrated in FIG. 4(b).

Note that in the low frequency drive ω2, it is preferable to cause the pixels 2 included in the specific row L to maintain light emission until the end of the one frame period Tfω2 after the elapse of the scanning period Tsω2. According to FIG. 4(b), a fast scan drive is used in which the scanning period in the low frequency drive ω2 is shorter than the one frame period Tfω2. After the fast scan drive in the one frame period Tfω2 is completed, scan is preferably not performed until the start of the next one frame period Tfω2.

As illustrated in FIG. 4(c), the scanning period Tsω2 may be shorter than the scanning period Tsω1, and each quenching period Tn in the case of the low frequency drive ω2 may be shorter than each quenching period Tn in the case of the high frequency drive ω1. If the quenching period Tn in the case of the low frequency drive ω2 is shorter than the quenching period Tn in the case of the high frequency drive ω1, occurrence of flicker can be more effectively suppressed.

Here, according to FIG. 4, in the high frequency drive ω1, the display device 1 is driven so that a time period from the start of writing in the first row L1 to the completion of writing in the last row Lk coincides with the one frame period Tfω1 (FIG. 4(a)). On the other hand, in the low frequency drive ω2, the display device 1 is driven so that a time period from the start of writing in the first row L1 to the completion of writing in the last row Lk is shorter than the one frame period Tfω2 (FIGS. 4(b) and (c)). As a result, a ratio of the total time of the quenching periods Tn relative to the one frame period Tfω2 can be smaller than a ratio of the total time of the quenching periods Tn relative to the one frame period Tfω1, and thus, occurrence of flicker can be effectively suppressed. Note that, the fact that the time of completion of writing in the last row Lk coincides with the time of completion of the one frame period Tfω1 includes not only a case where the time of completion of writing in the last row Lk and the time of completion of the one frame period Tfω1 are exactly the same, but also a case where the times substantially coincide, but have a slight difference due to conditions of a circuit design and the like.

Note that the time period during which the data signal D is written into the pixel 2 during the quenching period Tn in the low frequency drive ω2 is also preferably shorter than the time period during which the data signal D is written into the pixel 2 during the quenching period Tn in the high frequency drive ω1.

Figure 5:
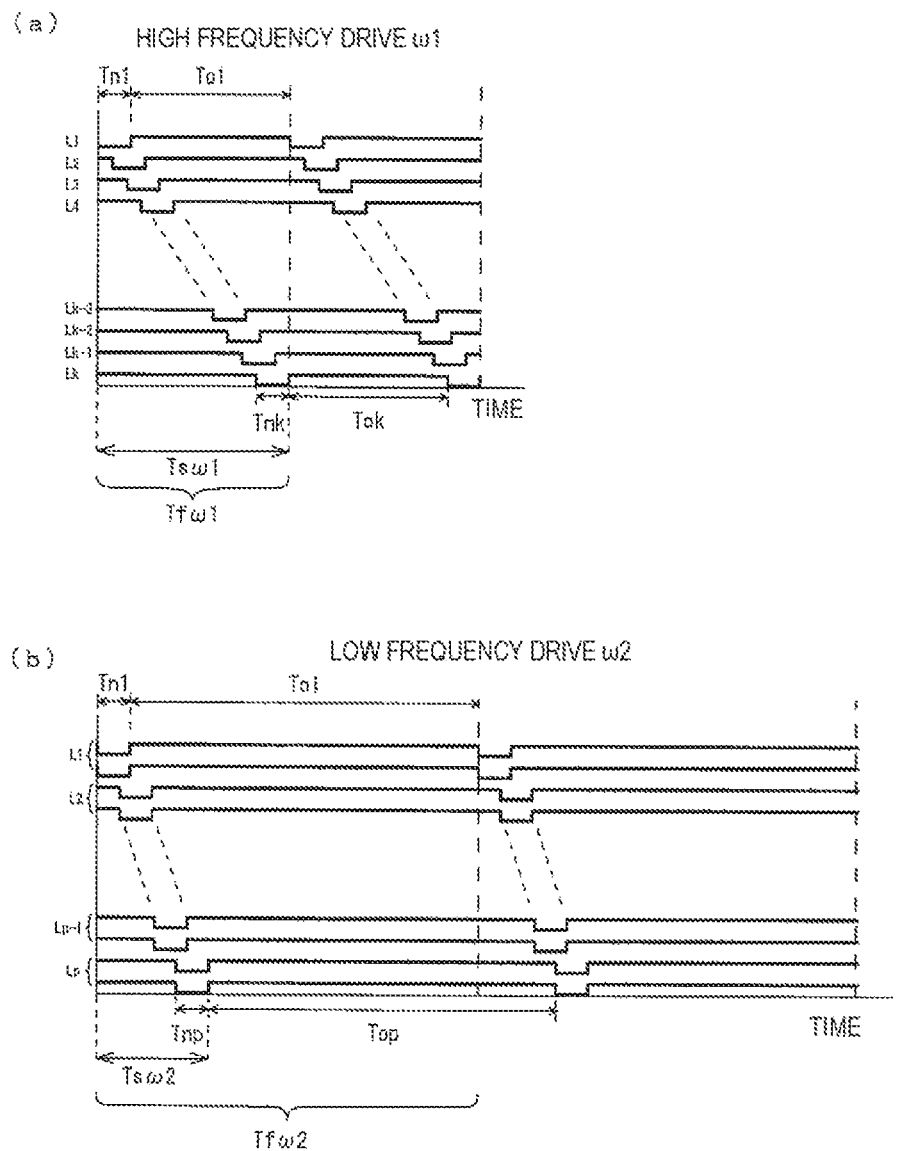
FIG. 5 is graphs for comparing a scanning period Ts (b) obtained when two rows are selected for the specific row L in a case where the display device 1 is driven in the low frequency drive ω2 with a scanning period Ts (a) in a case where the display device 1 is driven in the high frequency drive ω1.

In another example of the method of driving the display device 1, it is also preferable to select a plurality of rows for the specific row L in the low frequency drive ω2 and drive the display device 1 so that the scanning period Tsω2 is shorter than the scanning period Tsω1. FIG. 5 illustrates a state of the low frequency drive ω2 (FIG. 5(b)) together with a state of the high frequency drive ω1 (FIG. 5(a)) in a case where two rows are selected for the specific row L. Note that in FIG. 5(b), the specific rows L are identified as L1 to Lp by using the letter p to distinguish a difference from the number of rows being k in FIG. 5(a). Tn corresponding to the specific row L in FIG. 5(b) is denoted as Tn1 to Tnp, and To is denoted as To1 to Top. Here, p satisfies p≤j and is an integer greater than or equal to 1. According to the present embodiment, at a certain timing during the scanning period, for example, it is possible to provide a time period and perform drive so that, at a time when the scanning period Tsω1 and the scanning period Tsω2 start, the number of specific rows L belonging to the quenching period Tn is two in the low frequency drive ω2 and greater than one in the high frequency drive ω1. Therefore, even if the number of connection lines 7 included in the frame subjected to the high frequency drive ω1 and the low frequency drive ω2 is the same, the total time of the quenching period Tn in the low frequency drive ω2 can be shorter than the total time of the quenching period Tn in the high frequency drive ω1.

However, in the case of the high frequency drive ω1 in FIG. 5(a), the specific row L is one specific row, and a data signal is written into each of the pixels 2 included in the one specific row. On the other hand, in the low frequency drive ω2 in FIG. 5(b), two rows are selected for the specific row L, and a data signal is written into each of the pixels 2 included in the two rows. At this time, the same data signal is written to two of the pixels 2 connected to the same data line. That is, occurrence of flicker can be suppressed if a configuration is employed in which the resolution is reduced in half during the low frequency drive ω2 and the same potential is written to the two pixels 2 connected to the same data line.

When the display device 1 is driven in the low frequency drive ω2, the frequency is preferably 0.1 Hz to 45 Hz.

In addition, when the display device 1 is driven in the low frequency drive ω2 during the information reduction operation, it is possible to use, for a frame, a low frequency (second frequency) matrix m that is smaller than the entire matrix M illustrated in FIG. 1 in the case where the display device 1 is driven in the high frequency drive ω1 during the normal operation.

Second Embodiment

Figure 3:
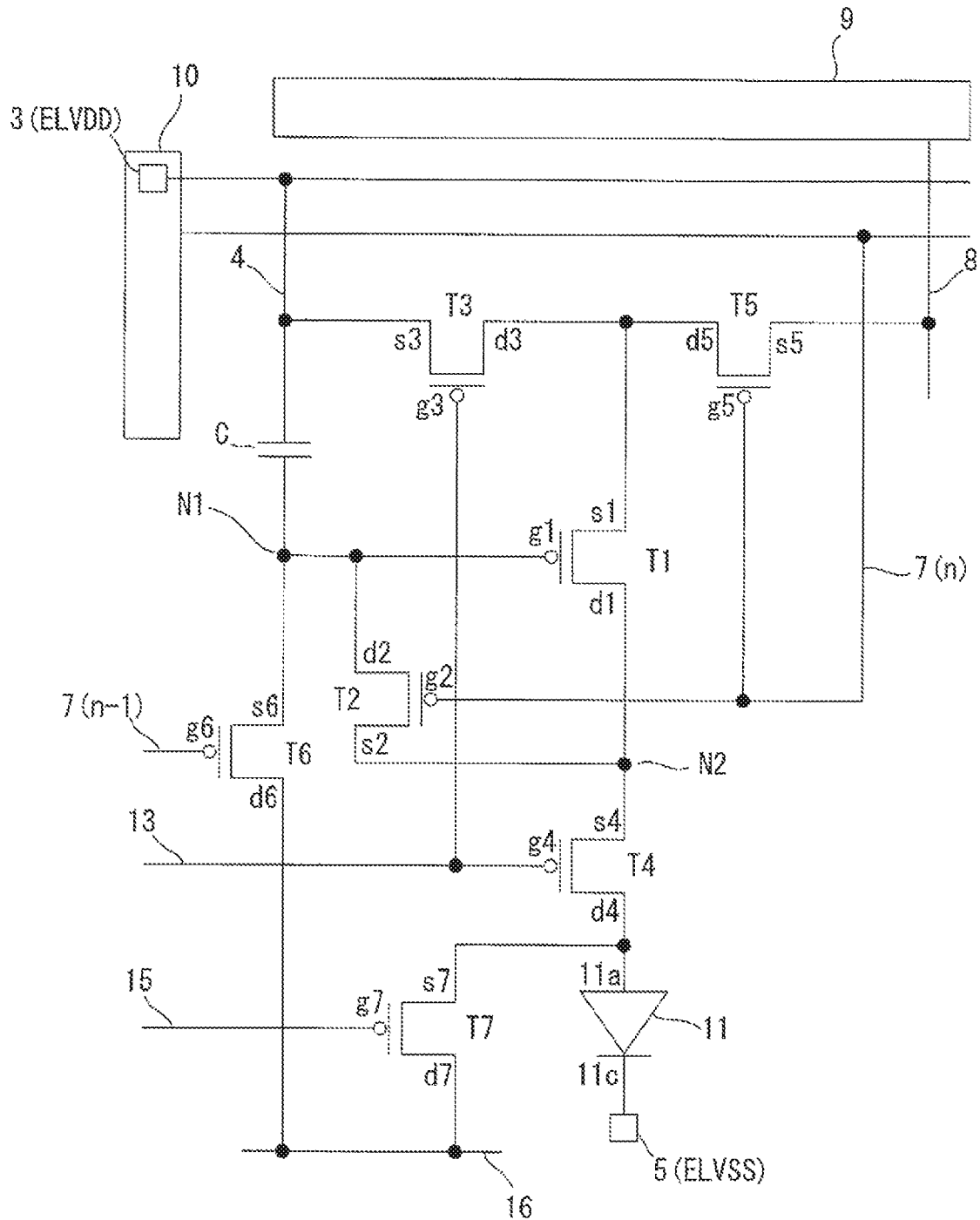
FIG. 3 is a diagram illustrating a circuit structure of the display device 1 according to a second embodiment.

FIG. 3 is a circuit diagram illustrating another embodiment of the display device 1 including the pixels 2 forming the matrix M in FIG. 1.

In FIG. 3, similarly to the first embodiment, the pixel 2, the drive power supply line 4 connected to the drive power supply 3, the cathode power supply line 6 connected to the cathode power supply 5, a connection line 7(n), and the data line 8 are provided.

The pixel 2 includes the organic EL element 11 serving as the electro-optical element, the drive transistor T1, the first connection transistor T2, and the capacitor C serving as a capacitance.

The organic EL element 11 receives, from the anode 11a via the drive power supply line 4, a current from the drive power supply 3 to emit light, and the cathode 11c is connected to the cathode power supply 5 via the cathode power supply line 6.

The drive transistor T1 is connected in series between the drive power supply 3 and the organic EL element 11. The drive transistor T1 causes a drive current Id corresponding to a potential of a gate g1 to flow from the drive power supply 3 to the organic EL element 11.

In the first connection transistor T2, the gate g2 is connected to the connection line 7(n), the source s2 is connected to the data line 8, and the drain d2 is connected to the gate g1 of the drive transistor T1. The first connection transistor T2 controls, according to a signal from the connection line 7(n), whether the data signal D from the data line 8 is supplied to the gate g1 of the drive transistor T1.

Furthermore, in the present embodiment, a source s1 of the drive transistor T1 is connected to a shared line 12 connecting the drive power supply 3 and the data line 8, and the source s2 of the first connection transistor T2 is connected between a drain d1 of the drive transistor T1 and the organic EL element 11.

A first blocking transistor T3 is connected in series and arranged between the drive transistor T1 and the drive power supply 3.

A second blocking transistor T4 that is connected in series closer to the organic EL element 11 than a node N2 relative to the first connection transistor T2 and has the same on-off operation as the first blocking transistor T3, is arranged between the drive transistor T1 and the organic EL element 11. In the present embodiment, a gate g3 of the first blocking transistor T3 and a gate g4 of the second blocking transistor T4 are both connected to a blocking line 13.

A second connection transistor T5 having the same on-off operation as the first connection transistor T2 is arranged between the drive transistor T1 and the data line 8. In the present embodiment, a gate g5 of the second connection transistor T5 is connected to the connection line 7(n), similarly to the gate g2 of the first connection transistor T2.

An initialization transistor T6 to which a source s6 is connected is arranged between the first connection transistor T2 and the capacitor C. A gate g6 of the initialization transistor T6 is connected to a connection line 7(n−1) that applies a voltage for performing the on-off operation of the initialization transistor T6. The connection line 7(n−1) is a line that scans, before the connection line 7(n), pixels included in a row adjacent to the connection line 7(n). Here, n is an integer.

Here, the on-off operations of the first blocking transistor T3 and the second blocking transistor T4, and the first connection transistor T2 and the second connection transistor T5 are driven inversely.

The capacitor C is inserted and arranged between the gate g1 of the drive transistor T1 and the drive power supply 3. The data signal D supplied via the first connection transistor T2 can be written into the capacitor C.

The initialization transistor T6 is turned off while the drive current Id flows through the organic EL element 11 from the writing of the data signal D into the capacitor C during at least one frame period.

Note that a source s7 of an initialization transistor T7 is connected between the second blocking transistor T4 and the organic EL element 11. An initialization line 15 is connected to a gate g7 of the initialization transistor T7. A drain d6 of the initialization transistor T6 and a drain d7 of the initialization transistor T7 are connected to an initial voltage line 16.

Next, an operation of the display device 1 according to the present embodiment will be described.

If a signal voltage is applied from the connection line 7(n), the first connection transistor T2 and the second connection transistor T5 are turned on. At this time, the first blocking transistor T3 and the second blocking transistor T4 connected to the blocking line 13 are turned off. As a result, an outflow of the data signal D from the data line 8 to the drive power supply line 4 is blocked.

Furthermore, the initialization transistor T6 connected to the connection line 7(n−1) is also turned off. This blocks a leakage current from the capacitor C in which writing of the data signal D is completed, to the initial voltage line 16.

Accordingly, the data signal D as the data voltage Vdata is written into the capacitor C from the data line 8 via the shared line 12 and the drive transistor T1. After the completion of the writing of the data signal D into the capacitor C, the application of the signal voltage from the connection line 7(n) is stopped, the first connection transistor T2 and the second connection transistor T5 are blocked, and the data voltage Vdata is held by the capacitor C.

The data voltage Vdata is applied to the gate g1 to turn on the drive transistor T1. Subsequently, when the first blocking transistor T3 and the second blocking transistor T4 that are turned off are turned on, the drive current Id flows from the drive power supply 3 to the organic EL element 11 via the drive transistor T1, and thus, the organic EL element 11 emits light. The drive current Id flows from the cathode power supply line 6 to the cathode power supply 5 through the organic EL element 11.

After the drive current Id flows through the organic EL element 11 until the end of the one frame period Tf, the first blocking transistor T3 and the second blocking transistor T4 are turned off, and the initialization transistor T6 and the initialization transistor T7 are turned on. Therefore, a voltage of a terminal on a side of the first connection transistor T2 of the capacitor C and a voltage of the anode 11a of the organic EL element 11 are returned to an initial voltage Vini. In the present embodiment, the quenching period Tn includes an operation in which the initialization transistor T6 and the initialization transistor T7 are turned on, and the voltage of the terminal on the side of the first connection transistor T2 of the capacitor C and the voltage of the anode 11a of the organic EL element 11 are returned to the initial voltage Vini.

Next, a method of driving the display device 1 according to the present embodiment will be described.

The display device 1 can form an image on the matrix by periodically scanning the matrix with the connection line 7(n) at a specific frequency in the column direction. The method of driving the display device 1 at a specific frequency includes the high frequency drive ω1 and the low frequency drive ω2 having a lower frequency than the high frequency drive ω1. The display device 1 can select any one of the high frequency drive ω1 and the low frequency drive ω2 under a predetermined condition.

During the normal operation such as an operation performed in a case where information is displayed on the display device 1 and the user actively attempts to acquire the information, the information needs to be displayed at high luminance to improve the visibility of the information. Furthermore, during the normal operation, the display device 1 is driven in the high frequency drive ω1 to accurately display image information, such as moving images, having large changes in time. In the present embodiment, the display device 1 is driven at 60 Hz in the high frequency drive ω1.

On the other hand, during the information reduction operation such as an operation during a standby time period during which the user does not actively acquire information, it is not necessary to display an image having large changes in time on the display device 1. During the information reduction operation, the display device 1 is preferably driven in the low frequency drive ω2 to reduce power consumption. In the present embodiment, the display device 1 is driven at 30 Hz in the low frequency drive ω2.

Here, in order to cause the organic EL element 11 to emit light, an operation of writing the data signal D into the capacitor C is necessary to turn on the drive transistor T1 by applying the data voltage Vdata to the gate g1.

In the present embodiment, the first blocking transistor T3 and the second blocking transistor T4 connected to the blocking line 13 are turned off during the write operation. This is to block the outflow of the data signal D from the data line 8 to the drive power supply line 4. Subsequently, if a signal voltage is applied from the connection line 7(*n*), the first connection transistor T2 and the second connection transistor T5 are turned on. Thus, the data signal D as the data voltage Vdata can be written into the capacitor C from the data line 8 via the shared line 12 and the drive transistor T1.

This is because, before the operation of writing the data signal D is performed, after the drive transistor T1 temporarily is turned off and the organic EL element 11 is quenched, it is necessary to write a new data signal D during the quenching period Tn to prevent the organic EL element 11 from emitting light due to unintended accumulation of the data voltage Vdata.

Furthermore, in the present embodiment, the voltage between the terminal on the side of the first connection transistor T2 of the capacitor C and the anode 11a of the organic EL element 11 after the end of one frame period Tf can be returned to the initial voltage Vini, and thus, it is possible to completely eliminate unintended data voltage Vdata.

In an example, a case where each row is selected for the specific row L will be described.

In the high frequency drive ω1 in the normal operation, as illustrated in FIG. 4(*a*), the display device 1 can be driven so that the scanning period Tsω1 and the one frame period Tfω1 coincide, and flicker is not observed even in such a drive.

On the other hand, in the low frequency drive ω2 in the information reduction operation, occurrence of flicker can be suppressed by setting the scanning period Tsω2 shorter than the scanning period Tsω1 as illustrated in FIG. 4(*b*).

Note that in the low frequency drive ω2, it is preferable to cause the pixels 2 included in the specific row L to maintain light emission until the end of the one frame period Tfω2 after the elapse of the scanning period Tsω2.

As illustrated in FIG. 4(*c*), the scanning period Tsω2 may be shorter than the scanning period Tsω1, and each quenching period Tn in the case of the low frequency drive ω2 may be shorter than each quenching period Tn in the case of the high frequency drive ω1. If the quenching period Tn in the case of the low frequency drive ω2 is shorter than the quenching period Tn in the case of the high frequency drive ω1, occurrence of flicker can be more effectively suppressed.

In another example of the method of driving the display device 1, it is also preferable to select a plurality of rows for the specific row L in the low frequency drive ω2 and drive the display device 1 so that the scanning period Tsω2 is shorter than the scanning period Tsω1. FIG. 5 illustrates a state of the low frequency drive ω2 (FIG. 5(*b*)) together with a state of the high frequency drive ω1 (FIG. 5(*a*)) in a case where two rows are selected for the specific row L.

However, in the case of the second embodiment, occurrence of leakage current while the drive current Id flows through the organic EL element 11 in one frame period can be suppressed by the first connection transistor T2 and the initialization transistor T6. That is, if the first connection transistor T2 and the initialization transistor T6 are provided, it is possible to further suppress occurrence of flicker compared to the first embodiment.

When the display device 1 is driven in the low frequency drive ω2, the frequency is preferably 10 Hz to 45 Hz.

In addition, when the display device 1 is driven in the low frequency drive ω2 during the information reduction operation, it is possible to use, for a frame, a low frequency (second frequency) matrix m that is smaller than the entire matrix M illustrated in FIG. 1 in the case where the display device 1 is driven in the high frequency drive ω1 during the normal operation.

The invention claimed is:

1. A display device driving method comprising:
    driving a frame formed by a plurality of pixels arranged in a matrix including rows and columns at a specific frequency selected from any one of a first frequency drive and a second frequency drive for driving the frame at a lower frequency than the first frequency drive;
    providing a quenching period and a light emission period in one frame period for a specific row included in a part of the frame and writing a data signal into pixels included in the specific row during the quenching period;
    sequentially starting a quenching period for a next specific row after a start of the quenching period for the specific row; and
    for a scanning period, at the specific frequency, from a start of a quenching period for a first row included in the frame to an end of a quenching period for a last row included in the frame, shortening a scanning period in the second frequency drive than a scanning period in the first frequency drive, and
    only one of the scanning period in the first frequency drive or the scanning period in the second frequency drive is selected in the one frame period.

2. The display device driving method according to claim 1, wherein a scan drive in which the scanning period in the second frequency drive is shorter than the one frame period is performed, and after the scanning period in the second frequency drive is finished in the one frame period, no scan is performed until a start of a next one frame period.

3. The display device driving method according to claim 1, wherein in the first frequency drive, the one frame period and a time period from a start of writing in the first row to an end of writing in the last row coincide, and in the second frequency drive, a time period from a start of writing in the first row to an end of writing in the last row is shorter than the one frame period.

4. The display device driving method according to claim 1, wherein a time period during which the data signal is written into the pixels included in the specific row during a quenching period in the second frequency drive is set shorter than a time period during which the data signal is written into the pixels included in the specific row during a quenching period in the first frequency drive.

5. The display device driving method according to claim 1, wherein a quenching period of the specific row in the second frequency drive is set shorter than a quenching period of the specific row in the first frequency drive.

6. The display device driving method according to claim 1,
wherein the specific row includes a plurality of rows in the second frequency drive, and
a quenching period of the plurality of rows and writing of the data signal into the pixels included in the specific row have the same timing.

7. The display device driving method according to claim 1, wherein at a certain timing during the scanning period, the number of specific rows during the quenching period is greater in the second frequency drive than in the first frequency drive.

8. The display device driving method according to claim 1, wherein the second frequency drive is a drive at 0.1 Hz to 45 Hz.

9. The display device driving method according to claim 1, wherein in the second frequency drive, a second frequency matrix formed by a region having a smaller area or a smaller number of pixels than the matrix is used as one frame.

10. The display device driving method according to claim 1,
wherein each of the plurality of pixels comprises
an electro-optical element configured to receive, from an anode, a current from a drive power supply and emit light, a cathode being connected to a cathode power supply in the electro-optical element,
a connection line formed along a horizontal direction for each row of the matrix,
a data line formed along a vertical direction for each column of the matrix,
a drive transistor connected in series between the drive power supply and the electro-optical element, the drive transistor configured to cause a drive current corresponding to a gate potential to flow from the drive power supply to the electro-optical element,
a first connection transistor including a gate connected to the connection line, the first connection transistor configured to control whether to supply a data signal from the data line to a gate of the drive transistor, and
a capacitance inserted and arranged between the gate of the drive transistor and the drive power supply, the data signal supplied via the first connection transistor being written into the capacitance.

11. A display device,
wherein a frame formed by a plurality of pixels arranged in a matrix including rows and columns is driven at a specific frequency selected from any one of a first frequency drive and a second frequency drive for driving the frame at a lower frequency than the first frequency drive,
a quenching period and a light emission period are provided in one frame period for a specific row included in a part of the frame, and a data signal is written into pixels included in the specific row during the quenching period,
after a start of the quenching period for the specific row, a quenching period for a next specific row is sequentially started, and
for a scanning period, at the specific frequency, from a start of a quenching period for a first row included in the frame to an end of a quenching period for a last row included in the frame, a scanning period in the second frequency drive is shorter than a scanning period in the first frequency drive, and
only one of the scanning period in the first frequency drive or the scanning period in the second frequency drive is selected in the one frame period.

12. The display device according to claim 11, wherein a fast scan drive in which the scanning period in the second frequency drive is shorter than the one frame period is performed, and after the scanning period in the second frequency drive is finished in the one frame period, no scan is performed until a start of a next one frame period.

13. The display device according to claim 11, wherein in the first frequency drive, the one frame period and a time period from a start of writing in the first row to an end of writing in the last row coincide, and in the second frequency drive, a time period from a start of writing in the first row to an end of writing in the last row is shorter than the one frame period.

14. The display device according to claim 11, wherein a time period during which the data signal is written into the pixels included in the specific row during a quenching period in the second frequency drive is set shorter than a time period during which the data signal is written into the pixels included in the specific row during a quenching period in the first frequency drive.

15. The display device according to claim 11, wherein a quenching period of the specific row in the second frequency drive is set shorter than a quenching period of the specific row in the first frequency drive.

16. The display device according to claim 11,
wherein the specific row includes a plurality of rows in the second frequency drive, and
a quenching period of the plurality of rows and writing of the data signal into the pixels included in the specific row have the same timing.

17. The display device according to claim 11, wherein at a certain timing during the scanning period, the number of specific rows during the quenching period is greater in the second frequency drive than in the first frequency drive.

18. The display device according to claim 11, wherein the second frequency drive is a drive at 0.1 Hz to 45 Hz.

19. The display device according to claim 11, wherein in the second frequency drive, a second frequency matrix formed by a region having a smaller area or a smaller number of pixels than the matrix is used as one frame.

20. The display device according to claim 11,
wherein each of the plurality of pixels comprises
an electro-optical element configured to receive, from an anode, a current from a drive power supply and emit light, a cathode being connected to a cathode power supply in the electro-optical element,
a connection line formed along a horizontal direction for each row of the matrix,
a data line formed along a vertical direction for each column of the matrix,
a drive transistor connected in series between the drive power supply and the electro-optical element, the drive transistor configured to cause a drive current corresponding to a gate potential to flow from the drive power supply to the electro-optical element, a first connection transistor including a gate connected to the connection line, the first connection transistor configured to control whether to supply a data signal from the data line to a gate of the drive transistor, and a capacitance inserted and arranged between the gate of the drive transistor and the drive power supply, the data signal supplied via the first connection transistor being written into the capacitance.

* * * * *